US006348392B1

(12) United States Patent
Nakayama et al.

(10) Patent No.: US 6,348,392 B1
(45) **Date of Patent: *Feb. 19, 2002**

(54) RESISTOR AND METHOD OF MANUFACTURING THE SAME

(75) Inventors: Shogo Nakayama; Naohiro Takashima, both of Fukui (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/403,184

(22) PCT Filed: Apr. 14, 1998

(86) PCT No.: PCT/JP98/01700

§ 371 Date: Dec. 29, 1999

§ 102(e) Date: Dec. 29, 1999

(87) PCT Pub. No.: WO98/47157

PCT Pub. Date: Oct. 22, 1998

(30) Foreign Application Priority Data

Apr. 16, 1997 (JP) ............................................ 9-098787

(51) Int. Cl.$^7$ ................................................ H01L 21/20
(52) U.S. Cl. ........................................ 438/382; 438/384
(58) Field of Search ................................. 438/382, 384

(56) References Cited

U.S. PATENT DOCUMENTS

| | | |
|---|---|---|
| 3,659,339 A | 5/1972 | Yamaguchi |
| 3,699,649 A | 10/1972 | McWilliams |
| 5,548,269 A | 8/1996 | Katsuno et al. |

FOREIGN PATENT DOCUMENTS

| | | |
|---|---|---|
| EP | 03025994 | 2/1991 |
| JP | S59-75607 | 10/1982 |
| JP | 8-306503 | 11/1996 |

OTHER PUBLICATIONS

European Search Report, application No. 98912794.9, dated Apr. 12, 2000.

Japanese language search report for Int'l Appln. No. PCT/JP98/017000 dated Jul. 14, 1998.

English translation of Japanese search report.

*Primary Examiner*—Long Pham
(74) *Attorney, Agent, or Firm*—Ratner & Prestia, P.C.

(57) ABSTRACT

A resistor has a low resistance which precisely falls within a prescribed range regardless of the variation in the contact position of the probes. The resistor comprises a substrate, a pair of upper-surface electrode layers having respectively a notched section, provided on both sides of upper surface of the substrate, a resistor layer provided so that it is connected electrically to said upper-surface electrode layers, a protective layer formed to cover at least the resistor layer and side-face electrode layers provided respectively on side faces of said substrate so that the side-face electrode layers are overlapping on part of upper surface of said upper-surface electrode layers for electrical connection. The above construction reduces the dispersion in measuring the resistance even if contact positions of the probes for the resistance measurement vary.

3 Claims, 12 Drawing Sheets

RESISTOR AND METHOD OF MANUFACTURING THE SAME

THIS APPLICATION IS A U.S. NATIONAL PHASE APPLICATION OF PCT INTERNATIONAL APPLICATION PCT/JP98/01700.

FIELD OF THE INVENTION

The present invention relates to a resistor used for high-density wiring circuit and a method for manufacturing the same.

BACKGROUND OF THE INVENTION

Japanese Patent Laid Open Publication No. S59-75607 teaches a conventional resistor.

The conventional resistor and the process of manufacturing are described in the following with reference to the drawings.

FIG. 11 shows plan view of a conventional resistor.

Shown in FIG. 11 are an insulating substrate 1, electrodes 2*a*, 2*b* provided on both sides of the upper surface of the substrate 1, a resistor element 3 provided between and over the electrodes 2*a*, 2*b* and side-face electrodes 4*a*, 4*b* which are provided on the side faces of the substrate 1 keeping electrical connection with the electrodes 2*a*, 2*b*, respectively. Numeral 5 denotes a trimmed groove formed as the result of trimming operation performed on the resister element 3.

Now in the following, a method for manufacturing the conventional resistor of above structure is described referring to the drawings.

FIG. 12 is a drawing used to illustrate key processes for manufacturing the conventional resistor.

In the first place, electrodes 14 are formed on the upper surface of an insulating substrate 11 of a sheet form; on the surface of which substrate, longitudinal cut lines 12 and lateral cut lines 13 have been provided for later breaking of the substrate. The electrodes 14 are formed independently in respective regions with respect to the direction of longitudinal cut line 12, while, in terms of lateral direction, the electrodes 14 are formed across the longitudinal cut line 12. And then, resistor elements 17 are provided in the form of a thick film laterally bridging the electrodes 14.

Next process is a trimming with a laser beam. The trimming is conducted while the resistance is being measured. The measurement of resistance and the trimming of a resistor element 17 are conducted for each of the resistor elements disposed in lateral direction. For example, each of the resistor elements on the uppermost line is measured the resistance by having a probe on each of the electrodes, and respective resistor elements are trimmed by means of laser beam irradiated thereon.

If necessary, an insulating protection layer of glass, or the like material, is formed on the surface, and then the insulating substrate is separated along the longitudinal cut line 12 to obtain a plurality of substrate sheets of a band shape. Depending on needs, side-face electrodes are provided in the form of a thick film covering both side faces of the band-shaped substrate sheet, and the surface of electrodes are plated if necessary.

After that, separating along the lateral cut line 13 provides individual chip resistors.

As described in the above, probes are put on the upper-surface electrode layers to provide electric current in a resistance layer in order to read voltage drop, and a certain groove is formed therein with a laser beam, or the like means, so that the reading of voltage drop reaches a level that represents a certain specific resistance of the resistance layer.

In the above described conventional structure and the manufacturing method, however, the resistance measured after the trimming dispersed widely depending on positional variation of the probes contacting to the upper-surface electrode layers. This is remarkable among the conventional resistors of low resistance.

The above problem is described more in detail with the aid of illustrations. FIG. 13 shows model paths of a resistance measuring current corresponding to various probe positions during trimming. FIGS. 13(*a*), (*b*) and (*c*) illustrate the cases with the high resistance resistors, while FIGS. 13(*d*), (*e*) and (*f*) are with the low resistance resistors.

In FIG. 13, numeral 23 represents position of a probe making contact to an upper-surface electrode layer, numeral 24 shows a path of electric current during measurement of resistance.

The current path 24 is least influenced by the variation in the position 23 of the probe on the upper-surface electrode layer, among those resistors whose resistance is high (ref. FIGS. 13(*a*), (*b*), (*c*)); therefore, no problem arises.

Among those resistors whose resistance is low, however, because of the small difference in the areal resistivity between the upper-surface electrode layer and the resistor layer, the electric current does not proceed through the entire portion of the resistor layer. A shift in the position 23 of probe contacting to the upper-surface electrode layer results in a significant variation of the current path 24, as shown in FIGS. 13(*d*), (*e*) and (*f*). Namely, the measured resistance depends on the contact position of probe on the upper-surface electrode. Therefore, despite a precise adjustment of the resistance to a prescribed level attained during the trimming operation, actual resistance after trimming disperse because of positional variation in the contact of probe to the upper-surface electrode.

The present invention addresses the above problem involved in the measuring of a resistance of conventional resistors, and intends to provide a resistor of low resistance, including the method of manufacture, the resistance of which precisely falls within a prescribed range regardless of the variation in the contact position of the probes.

SUMMARY OF THE INVENTION

A resistor in accordance with an exemplary embodiment of the present invention comprises a substrate, a pair of upper-surface electrodes, which respectively having notched section, provided on both sides of the upper surface of the substrate, a resistor layer provided so that it is connected electrically to the upper-surface electrode layers, a protective layer formed to cover at least the resistance layer, and a couple of side-face electrodes which are provided on both side faces of the substrate so that the side-face electrodes can be electrically connected to the upper-surface electrode in a state where the side-face electrodes overlap on part of the upper-surface electrodes.

Because of the notched section disposed in the pair of upper-surface electrodes provided on both sides of the upper surface of the substrate, path of the electric current flowing in a resistor element remains in a same stable route even if contact position of the probes varies during the trimming operation. Thus, even among the resistors of low resistance, their resistance can be controlled precisely to be within a prescribed range.

BEST MODE FOR CARRYING OUT THE INVENTION

Embodiment 1

A resistor in accordance with a first exemplary embodiment of the present invention, as well as the method of manufacture, is described in the following with reference to the drawings.

Figure 1:
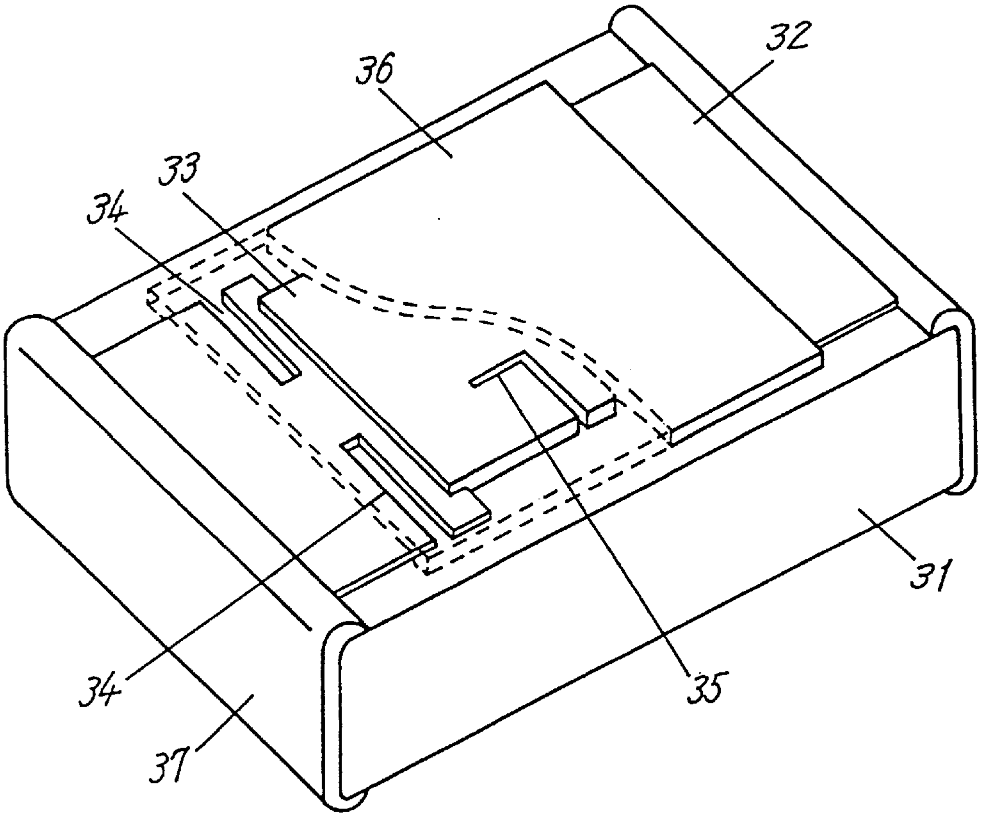
FIG. 1 is a partially-cutoff perspective view showing a resistor in accordance with a first exemplary embodiment of the present invention.

FIG. 1 is a perspective view of the resistor, with part of it removed.

Referring to FIG. 1, a substrate 31 is made of alumina or the like material, a pair of upper-surface electrode layers 32 are made of a mixed composition of silver and glass, or the like material, provided on both sides of the upper surface of the substrate 31. A resistor layer 33 is made of a mixed composition of ruthenium oxide and glass, or a mixed composition of silver, palladium and glass, or the like material, provided on the substrate 31 so that part of the layer 33 is disposed overlapped on the pair of upper-surface electrode layers 32 for electrical connection. A couple of notched sections 34 provided along the same direction and opposite direction as the width direction of the substrate are formed in the upper-surface electrode layer 32 during its formation by printing, being formed from both sides of the upper-surface electrode layer 32 towards the middle of the layer leaving a middle portion for a length approximately one quarter of the width length of the upper-surface electrode layer. A groove 35 is provided using a laser beam, or the like means, for adjusting resistance of the resistor layer 33 to a certain predetermined value. A protective layer 36 is formed of a glass of lead borosilicate system to cover at least the resistor layer 33, and a couple of side-face electrode layers 37 are formed of a mixed composition of silver and glass provided on both side face of the substrate 31 so that the layer 37 is electrically connected to the upper-surface electrode layer 32. Depending on needs, the side-face electrode layer 37 is further provided with a first plating layer (not shown) of nickel or the like material; furthermore a second plating layer (not shown) is provided covering the first plating layer, if it is required.

A method for manufacturing the above resistor is described in the following with reference to the drawings.

Figure 2A:
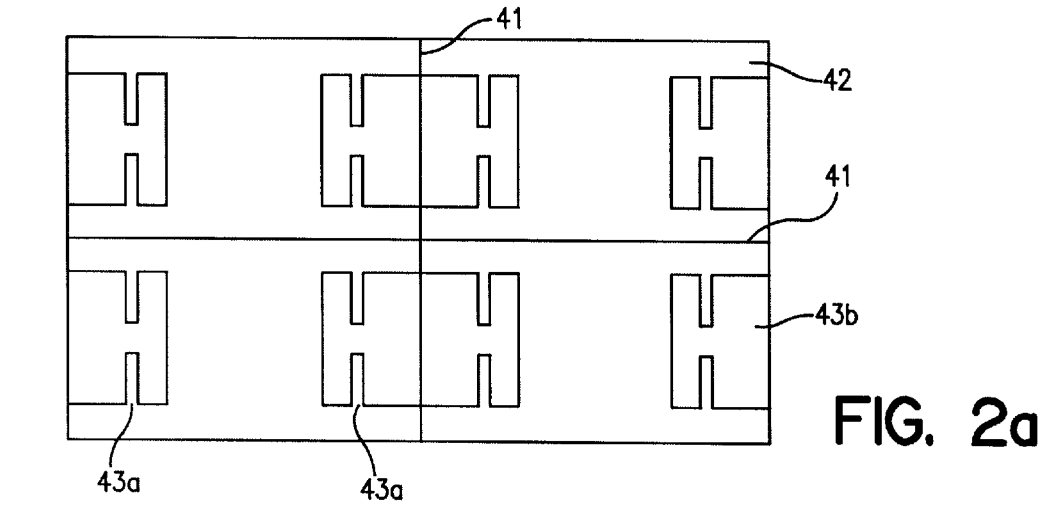
FIGS. 2(*a*)–(*c*) illustrate a process of manufacturing the resistor.
Figure 2B:
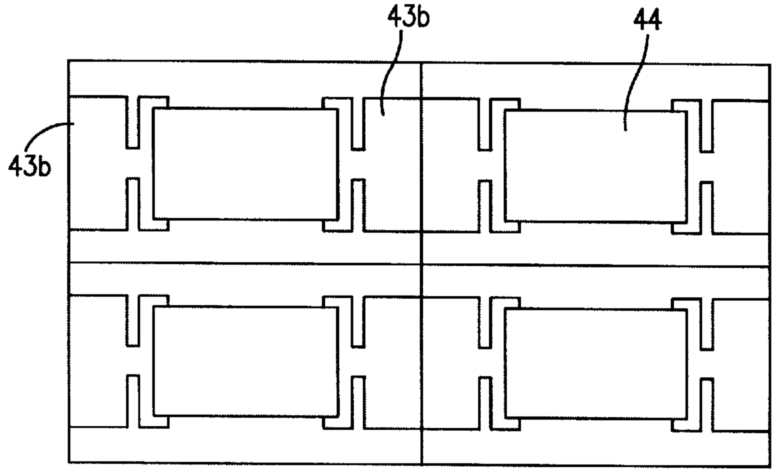
Figure 2C:
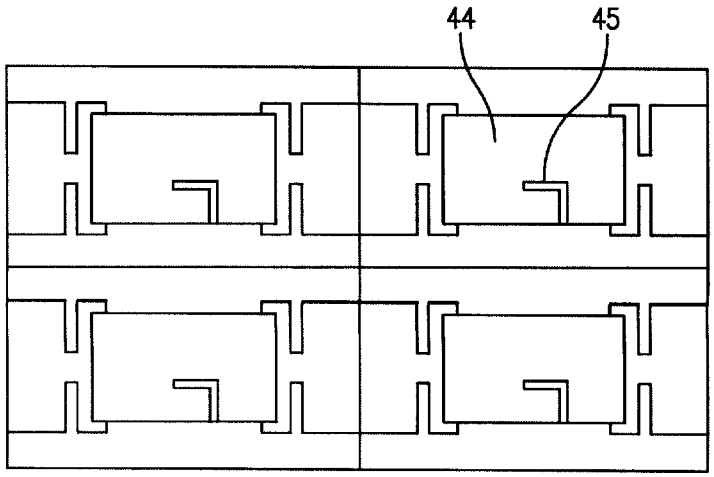
Figure 3A:
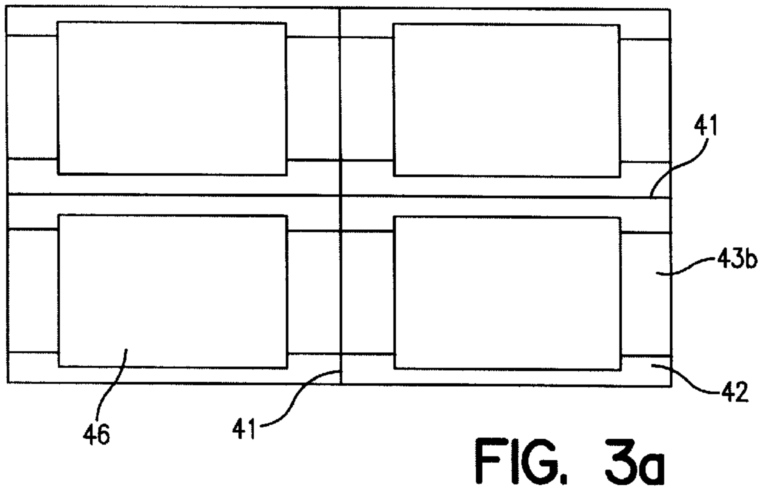
FIGS. 3(*a*)–(*d*) illustrate a process of manufacturing the resistor.
Figure 3B:
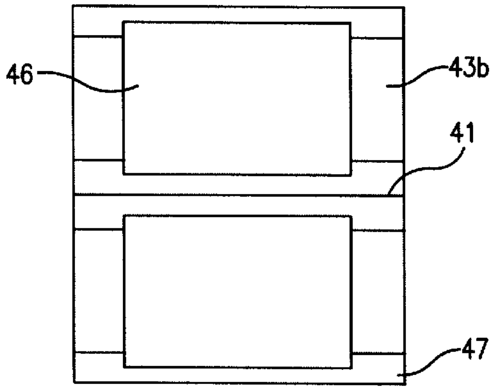
Figure 3C:
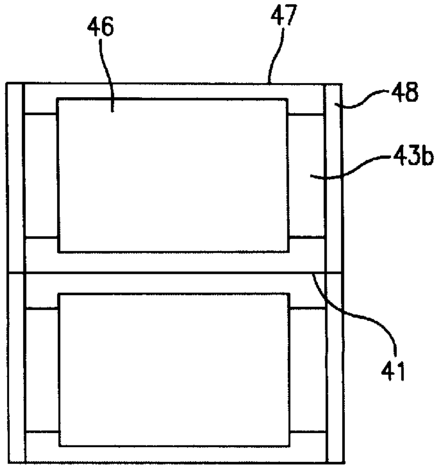
Figure 3D:
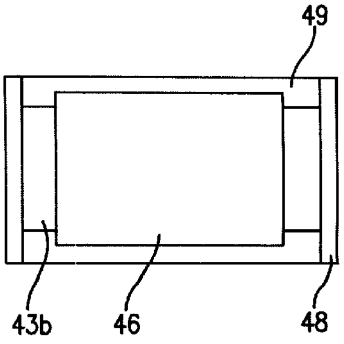

FIG. 2 and FIG. 3 illustrate a process of manufacturing a resistor in accordance with a first exemplary embodiment of the present invention.

In the first place, as shown in FIG. 2(*a*), on the surface of a sheet substrate 42 made of alumina, or the like material, provided with longitudinal and lateral cut lines 41, upper-surface electrode layers 43*b* each having notched sections 43*a* are formed by screen-printing a paste of silver/glass mixture composition across the longitudinal or lateral cut lines 41 using a printing mask in which the notched sections are included; which is dried and then baked in a belt furnace at approximately 850° C. for approximately 45 min. If necessary, reverse-surface electrode layers (not shown) may be formed simultaneously on the reverse surface of the substrate 42 in the places corresponding to the upper-surface electrode layers 43*b*, by screen-printing and drying the paste of silver/glass mixture composition.

Then, as shown in FIG. 2(*b*), resistor layers 44, which electrically connect the upper-surface electrode layers 43*b*, are formed on the upper surface of the substrate 42 by screen-printing a paste of mixed composition of ruthenium oxide and glass partly overlapping on the respective upper-surface electrode layers 43*b*; which is dried and then baked in a belt furnace at approximately 850° C. for approximately 45 min.

Then, as shown in FIG. 2(*c*), a groove 45 is formed by trimming the resistor layer 44 with a laser beam, or the like means, in order to adjust resistance of the resistor layer 44 to a certain predetermined value. A pre-coating (not shown) of borosilicate glass, or the like material, may be provided prior to the trimming, and then the pre-coating and the resistor layer 44 may be trimmed together with a laser beam, or the like means, from above the pre-coating for forming the groove 45.

Then, as shown in FIG. 3(*a*), protective layers 46 are formed by screen-printing a glass paste of lead borosilicate system covering the upper surface of at least the resistor layer 44; which is dried and then baked in a belt furnace at approximately 620° C. for approximately 45 min.

Then, as shown in FIG. 3(*b*), the substrate 42 is separated along the cut line 41 so that the upper-surface electrode layer 43*b* is exposed at the side-surface of the substrate. Thus a bar-shaped substrate 47 is obtained.

Then, as shown in FIG. 3(*c*), side-face electrode layers 48 are formed through a transfer-printing using a roller; a paste of silver/glass mixture composition is applied on the side face of the bar-shaped substrate 47 so that it overlaps on part of the upper-surface electrode layers 43*b* for having electric connection, which is dried and then baked in a belt furnace at approximately 620° C. for approximately 45 min.

Then, as shown in FIG. 3(*d*), the bar-shaped substrate 47 (not shown in the present drawing) is separated into individual piece substrate 49.

Finally, depending on needs, a first layer of nickel plating, or the like material, may be provided, as a barrier layer, to cover the exposed portion of the upper-surface electrode layer 43*b* and the side-face electrode layer 48, and a second layer of tin/lead alloy solder plating, or the like material, to cover the first layer. This completes a finished resistor.

Although in the above described first embodiment a glass of lead borosilicate system has been used as an example of the material for the protective layer, a resin of epoxy group or the like material may also be used instead.

Although in the first embodiment a silver/glass mixture composition has been used as an example of the material for the side-face electrode layer, a phenol resin containing nickel powders, or the like material, may also be used instead.

Although in the first embodiment the upper-surface electrode layer 43*b* having the notched section 43*a* has been provided through a screen-printing process using a printing mask including notched section 43*a*, the notched section 43*a* may also be provided instead by cutting an upper-surface electrode layer 43*b* with a laser beam, or the like means.

The function of the above resistor is described in the following with reference to the drawings.

Figure 4A:
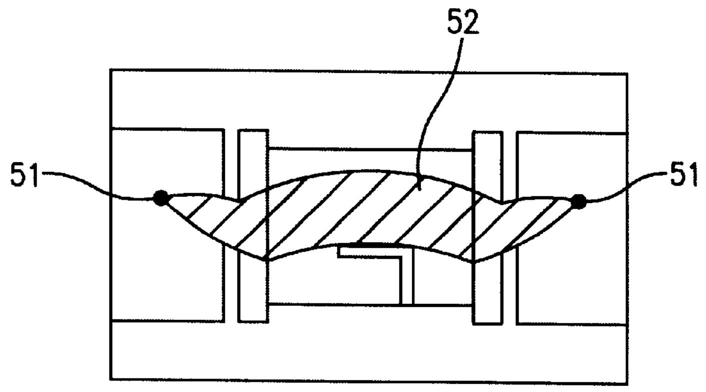
FIGS. 4(*a*)–(*c*) show path models of electric current flow during measurement of the resistance of the resistor.
Figure 4B:
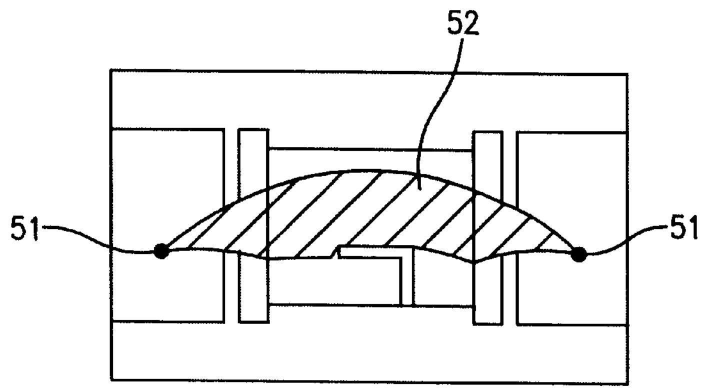
Figure 4C:
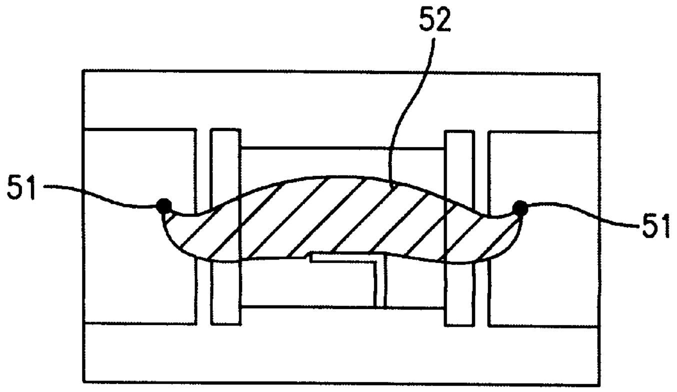

FIGS. 4(*a*), (*b*) and (*c*) illustrate operational models in a resistor of embodiment 1 still under the manufacturing process. The contact positions of probes on the upper-surface electrode layers during trimming are indicated with numeral 51. The path of electric current flowing during measurement is indicated with numeral 52. In the drawings, the position 51 of probe contact is varying. As seen in FIGS. 4(*a*), (*b*) and (*c*), the path of electric current flow does not show a significant change despite the variation in the contact position of the probes in a resistor of the present embodiment 1; as compared with FIG. 13(*d*), (*e*) and (*f*), where the path of electric current significantly changed during the resistance measurement. The notched section in the upper-surface electrode layer curtails changing of the current path. Thus, a precise resistance can be measured regardless of the variation in the contact position of the probes with the upper-surface electrode layer; therefore, the accuracy of the trimming is improved.

The characteristics of resistors are compared in the following.

Using a 4-point probe for the low resistance measurement, resistor elements of 70 mΩ average resistance have been trimmed to a targeted resistance of 100 mΩ. A deviation of the resistance after the trimming was measured.

Table 1 compares the deviation in the accuracy of the trimming among the conventional resistors and those of embodiment 1 of the present invention.

TABLE 1

| | Conventional | Embodiment 1 | Embodiment 2 | Embodiment 3 |
|---|---|---|---|---|
| Average (mΩ) | 100.5 | 100.3 | 100.2 | 99.9 |
| Max. (mΩ) | 102.4 | 100.9 | 100.7 | 100.6 |
| Min. (mΩ) | 98.8 | 99.5 | 99.5 | 99.2 |
| 3 × Cv (%) | 2.04 | 0.74 | 0.63 | 0.69 |

Cv = Standard deviation/average × 100

As seen in Table 1, a resistor in accordance with embodiment 1 of the present invention has a structure that is least influenced by the positional variation of contact probes on the upper-surface electrode layer in the measurement of resistance, as compared with that of conventional resistors. Therefore, the accuracy of the trimming is improved; as a result, resistors may be provided with a resistance precisely adjusted to be close to a targeted value.

Embodiment 2

A resistor in accordance with a second exemplary embodiment of the present invention, as well as the method of manufacture, is described in the following with reference to the drawings.

Figure 5:
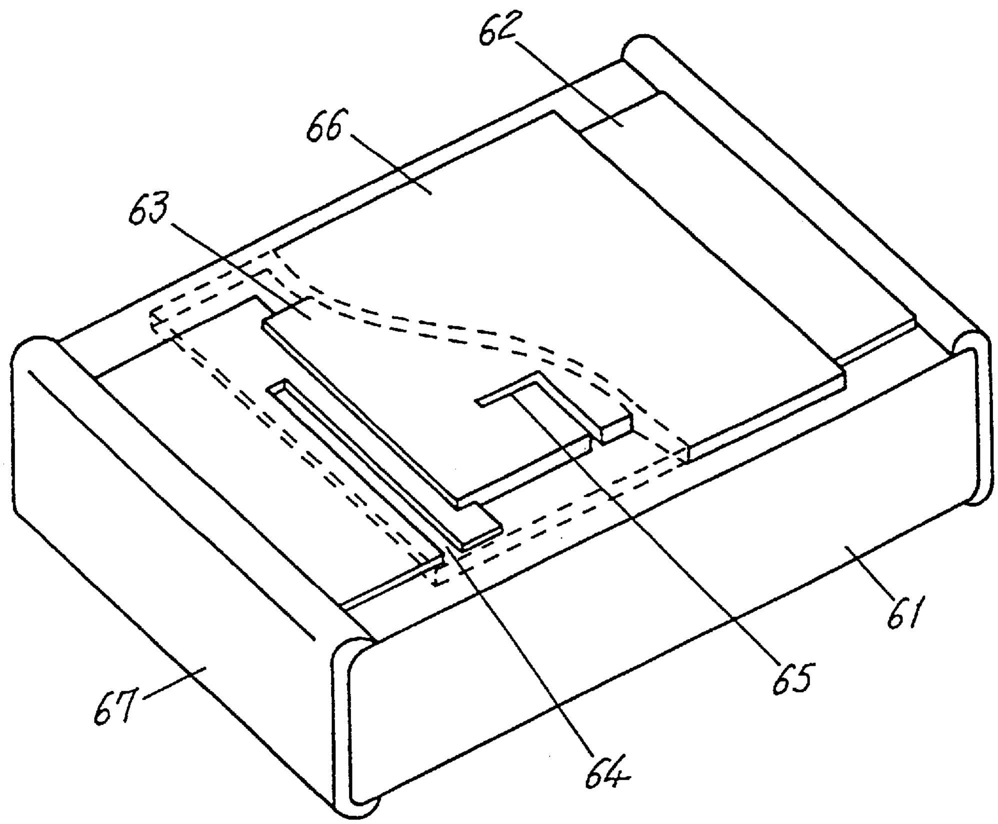
FIG. 5 is a partially-cutoff perspective view showing a resistor in accordance with a second exemplary embodiment of the present invention.
Figure 6A:
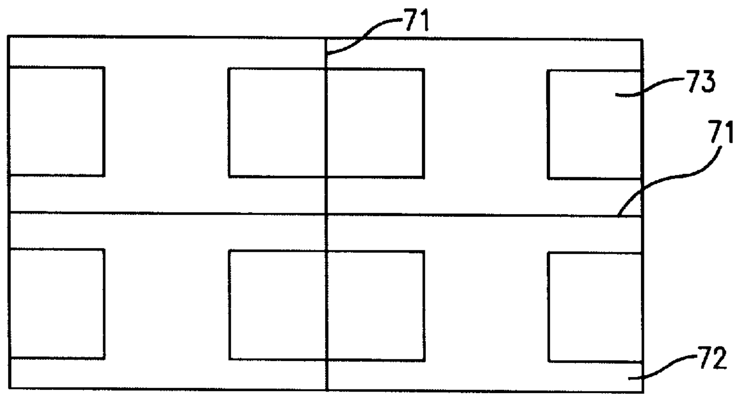
FIGS. 6(*a*)–(*d*) illustrate a process of manufacturing the resistor.
Figure 6B:
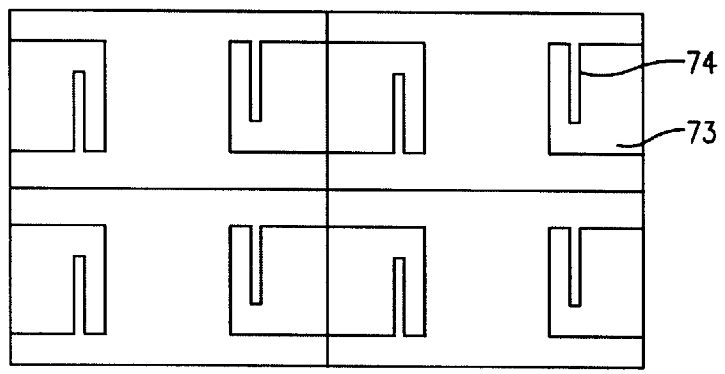
Figure 6C:
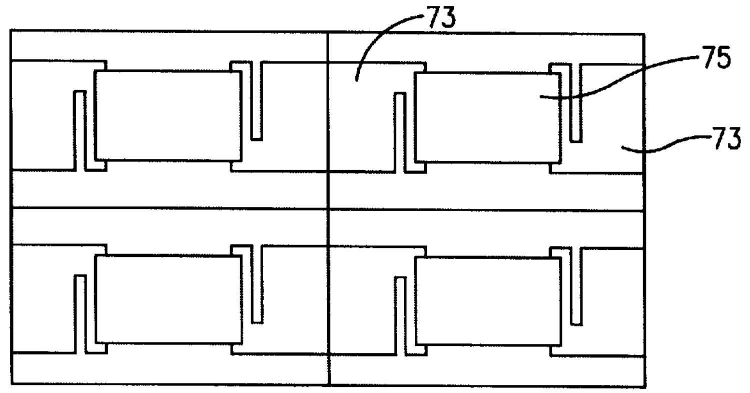
Figure 6D:
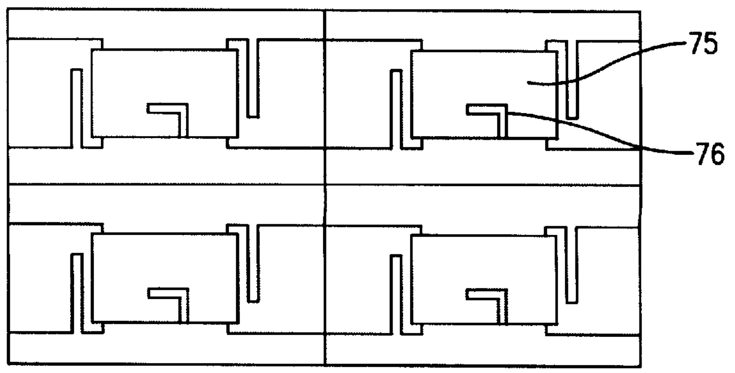
Figure 7A:
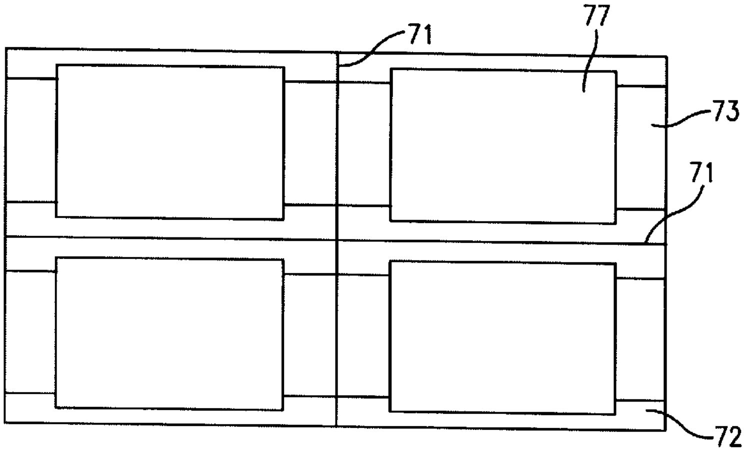
FIGS. 7(*a*)–(*d*) illustrate a process of manufacturing the resistor.
Figure 7B:
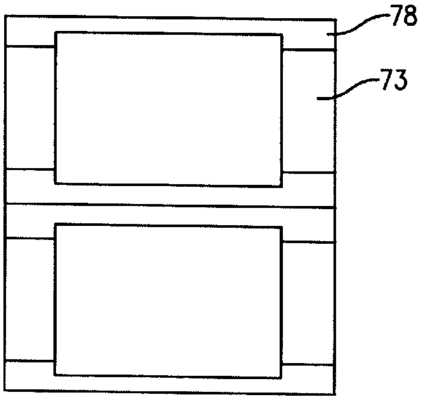
Figure 7C:
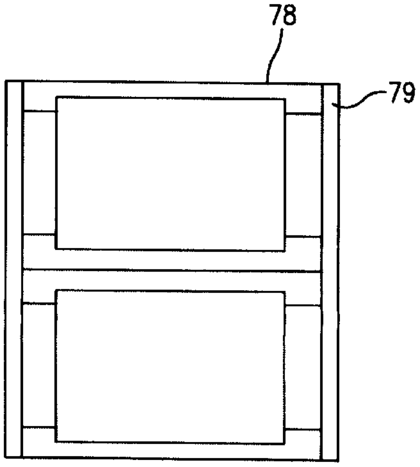
Figure 7D:
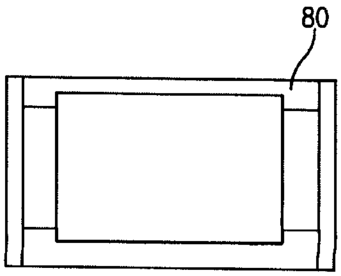

FIG. 5 is a partially cutoff perspective view of the resistor of embodiment 2.

Referring to FIG. 5, a substrate 61 is made of alumina or the like material, a pair of upper-surface electrode layers 62 are formed of a mixed composition of silver and glass, or the like material, provided on both sides of the upper surface of the substrate 61, a resistance layer 63 is formed of a mixed composition of ruthenium oxide and glass, a mixed composition of silver, palladium and glass, or the like material, provided on the substrate 61 so that part of the layer 63 is disposed overlapped on the upper-surface electrode layers 62 for electrical connection, a notched section 64 is formed by a laser beam, or the like means, in each of the pair of upper-surface electrode layers 62 along the same direction as the width direction of the substrate 61 in a disposition opposing to each other, for a length occupying approximately three quarters of the width of the upper-surface electrode layer 62, a groove 65 is formed using a laser beam, or the like means, for adjusting resistance of the resistor layer 63 to a certain predetermined value, a protective layer 66 is formed of a glass of lead borosilicate system covering at least the resistor layer 63, and side-face electrode layers 67 are formed of a mixed composition of silver and glass provided on both side faces of the substrate 61 so that the layers are electrically connected to the upper-surface electrode layers 62. Depending on needs, the side-face electrode layer 67 is provided with a first plating layer (not shown) of nickel or the like material; furthermore, a second plating layer (not shown) is provided, if it is needed, covering the first plating layer.

A method for manufacturing the above resistor is described in the following with reference to the drawings.

FIG. 6 and FIG. 7 illustrate a process for manufacturing a resistor in accordance with a second exemplary embodiment of the present invention.

In the first place, as shown in FIG. 6(*a*), on the surface of a sheet substrate 72 made of alumina, or the like material, provided with longitudinal and lateral cut lines 71, upper-surface electrode layers 73 are formed by screen-printing a paste of silver/glass mixture composition across the cut line 71; which is dried and then baked in a belt furnace at approximately 850° C. for approximately 45min. If necessary, reverse-surface electrode layers (not shown) may be formed simultaneously by screen-printing and drying the paste of silver/glass mixture composition on the reverse surface of the sheet substrate 72 in the places corresponding to the upper-surface electrode layers 73.

Then, as shown in FIG. 6(*b*), a pair of notched sections 74 are formed, using a laser beam, or the like means, in the pair of upper-surface electrode layers 73 respectively, along the same direction as the width direction of the substrate in a disposition opposing to each other.

Then, as shown in FIG. 6(*c*), resistor layers 75, which electrically connect the upper-surface electrode layers 73, are formed on the upper surface of the substrate 72 by screen-printing a paste of a mixed composition of ruthenium oxide and glass partly overlapping with respective upper-surface electrode layers 73; which is dried and then baked in a belt furnace at approximately 850° C. for approximately 45 min.

Then, as shown in FIG. 6(*d*), a groove 76 is formed by trimming the resistor layer 75 using a laser beam, or the like means, in order to adjust resistance of the resistor layer 75 to a certain predetermined value. A pre-coating (not shown)

of borosilicate glass, or the like material, may be provided prior to the trimming operation, and then the pre-coating and the resistor layer 75 may be trimmed with a laser beam, or the like means, from above the pre-coating to form the groove 76.

Then, as shown in FIG. 7(*a*), protective layers 77 are formed by screen-printing a glass paste of lead borosilicate system covering the upper surface of at least the resistor layer 75 (not shown in the present drawing); which is dried and then baked in a belt furnace at approximately 620° C. for approximately 45 min.

Then, as shown in FIG. 7(*b*), substrate 72 (not shown in the present drawing) is separated along the cut line 71 so that the upper-surface electrode layer 73 is exposed at the side surface of the substrate. Thus a bar shaped substrate 78 is obtained.

Then, as shown in FIG. 7(*c*), side-face electrode layers 79 are formed through a transfer-printing process using a roller; a paste of silver/glass mixture composition is applied on the side face of the bar shaped substrate 78 so that it overlaps on part of the upper-surface electrode layers 73 for having electric conduction; which is dried and then baked in a belt furnace at approximately 620° C. for approximately 45 min.

Then, as shown in FIG. 7(*d*), the bar shaped substrate 78 (not shown in the present drawing) is separated into individual piece substrate 80.

Finally, depending on needs, a first layer of nickel plating, or the like material, may be provided, as a barrier layer, covering exposed portion of the upper-surface electrode layer 73 and the side-face electrode layer 79, and a second layer of tin/lead alloy solder plating, or the like material, covering the first layer. This completes a finished resistor.

Although in the above described second embodiment a glass of lead borosilicate system has been used as an example of the material for the protective layer, a resin of epoxy group or the like material may also be used instead.

Although in the second embodiment a silver/glass mixed composition has been used as an example of the material for the side-face electrode layer, a phenol resin containing nickel powder or the like material may also be used instead.

The process of forming a notched section 74 in the upper-surface electrode layer 73 may be placed instead after the formation of resistor layer 75 or the formation of pre-coating, for obtaining the same effect.

Although in the second embodiment the notched section 74 has been formed by cutting an upper-surface electrode layer 73 using a laser beam, or the like means, the notched section may also be provided instead simultaneously with the formation of the upper-surface electrode layer 73, through a screen-printing process by using a printing mask including the notched section 74.

The operation of the above resistor is described in the following with reference to the drawings.

Figure 8A:
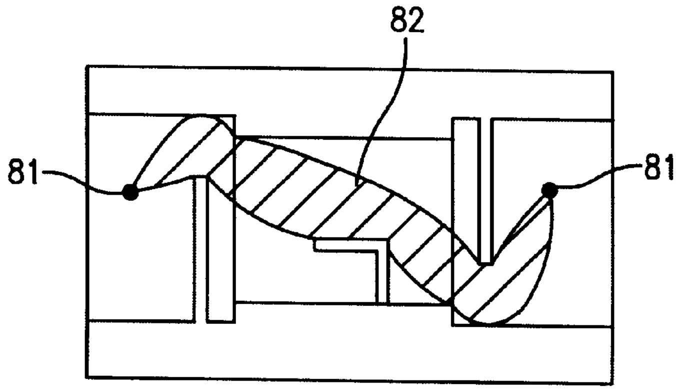
FIGS. 8(*a*)–(*c*) show path models of electric cur rent flow during measurement of the resistance of the resistor.
Figure 8B:
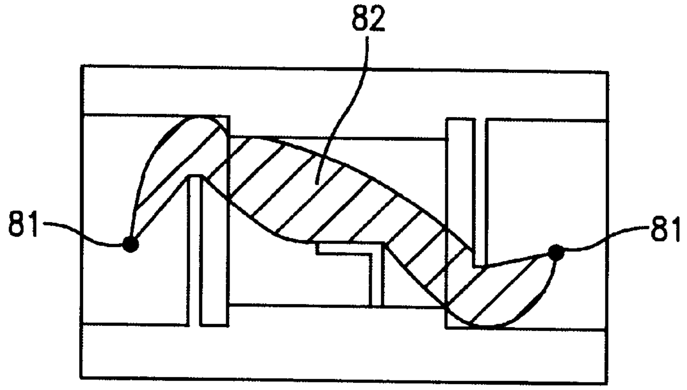
Figure 8C:
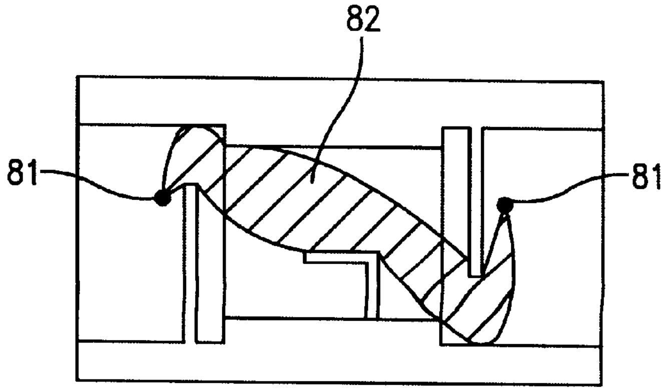

FIGS. 8(*a*), (*b*) and (*c*) illustrate operational models in a resistor of embodiment 2 still under the manufacturing process. The contact positions of the probes on the upper-surface electrode layers during trimming are indicated with numeral 81. The path of electric current during measurement of resistance is indicated with numeral 82. In the drawings, the probe contact positions 81 are varying. As seen in FIGS. 8(*a*), (*b*) and (*c*), the path of electric current does not show a significant change despite the variation in the probe contact positions in the present embodiment 2; as compared with FIGS. 13(*d*), (*e*) and (*f*), where the path of electric current flow significantly changed during the resistance measurement. The notched section provided in the upper-surface electrode layers curtails the change of electric current path. Thus, a precise value of resistance is measured regardless of the variation in the contact position of the probes with the upper-surface electrode layer; therefore, the accuracy of the trimming is improved.

The characteristics of resistors are compared in the following.

Using a 4-point probe for the low resistance measurement, sheets of 70 mΩ average resistance resistor have been trimmed to a targeted 100 mΩ of resistance. A deviation of the resistance after the trimming was measured.

The above-presented Table 1 compares the dispersion in the accuracy level of the trimming among the conventional resistors and those of embodiment 2 of the present invention.

As seen in Table 1, a resistor in accordance with embodiment 2 of the present invention has a structure that is least influenced by the positional variation of the contact probes on the upper-surface electrode layer in the measurement of resistance, as compared with that of conventional resistors. Therefore, the accuracy of the trimming is improved; as a result, resistors may be presented with a resistance precisely adjusted to be close to a targeted value.

Embodiment 3

A resistor in accordance with a third exemplary embodiment of the present invention, as well as the method of manufacture, is described in the following with reference to the drawings.

Figure 9:
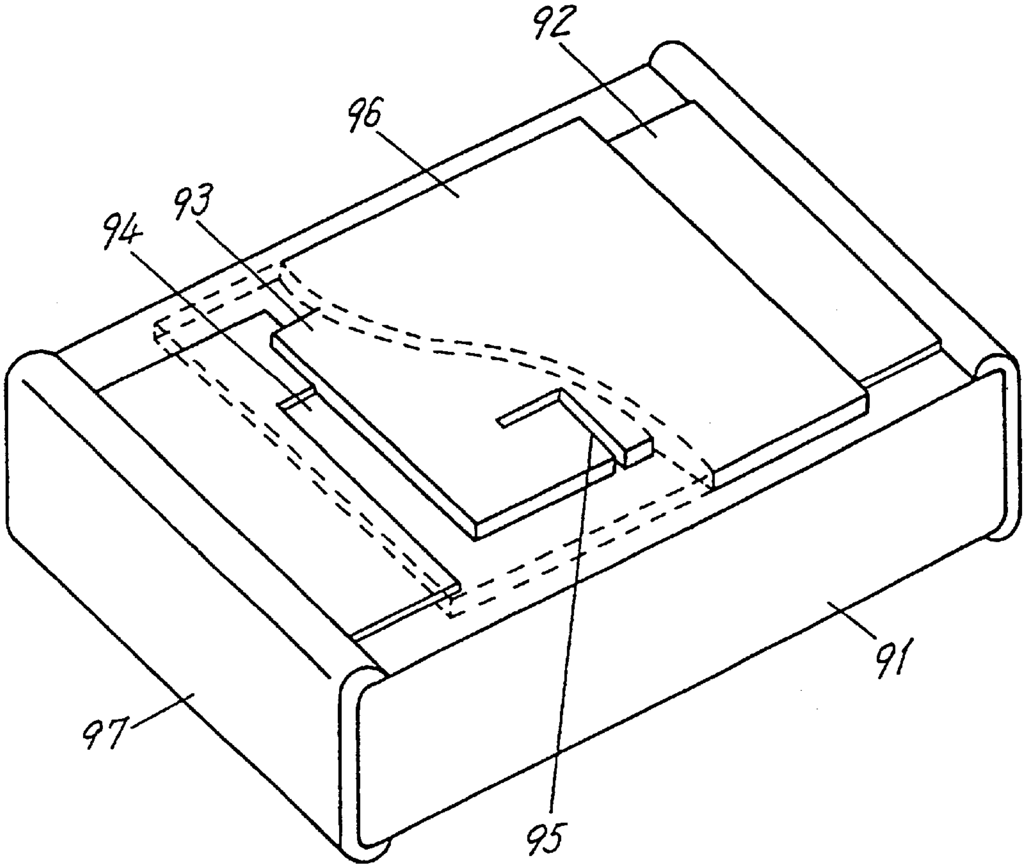
FIG. 9 is a partially-cutoff perspective view showing a resistor in accordance with a third exemplary embodiment of the present invention.

FIG. 9 is a partially cutoff perspective view of a resistor of embodiment 3.

Referring to FIG. 9, a substrate 91 is made of alumina or the like material, a pair of upper-surface electrode layers 92 are made of a mixed composition of silver and glass, or the like material, provided on both sides of the upper surface of the substrate 91, a resistor layer 93 is made of a mixed composition of ruthenium oxide and glass, a mixed composition of silver, palladium and glass, or the like material, provided on the substrate 91 so that part of the layer 93 is disposed overlapped on the pair of upper-surface electrode layers 92 for electrical connection, a notched section 94 is formed in the upper-surface electrode layer 92 during the formation by a printing process so that the upper-surface electrode layer 92 makes contact to the resistor layer 93 with a length approximately only one quarter of the width of the upper-surface electrode layer 92, a groove 95 is formed using a laser beam, or the like means, for adjusting resistance of the resistor layer 93 to a predetermined value, a protective layer 96 is formed of a glass of lead borosilicate system, an epoxy resin or the like material, covering at least the resistance layer 93, and side-face electrode layers 97 are formed of a mixed composition of silver and glass provided on the side faces of the substrate 91 so that the layers are electrically connected to the upper-surface electrode layers 92. Depending on needs, the side-face electrode layer 97 is provided with a first plating layer (not shown) of nickel or the like material; furthermore a second plating layer (not shown) is provided covering the first plating layer, when it is required.

The method of manufacturing the above resistor basically remains the same as that in the already-described embodiments 1 and 2 of the present invention. Therefore, description of which is omitted here.

Now in the following, the operation of the above resistor is described with reference to the drawings.

Figure 10A:
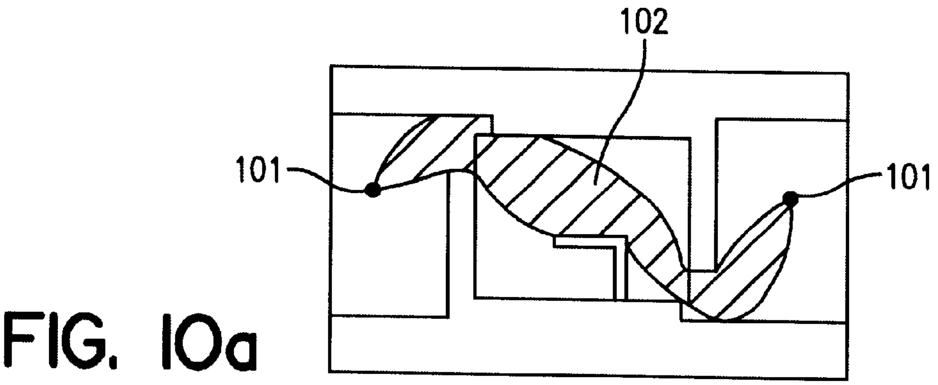
FIGS. 10(*a*)–(*c*) show path models of electric current flow during measurement of the resistance of the resistor.
Figure 10B:
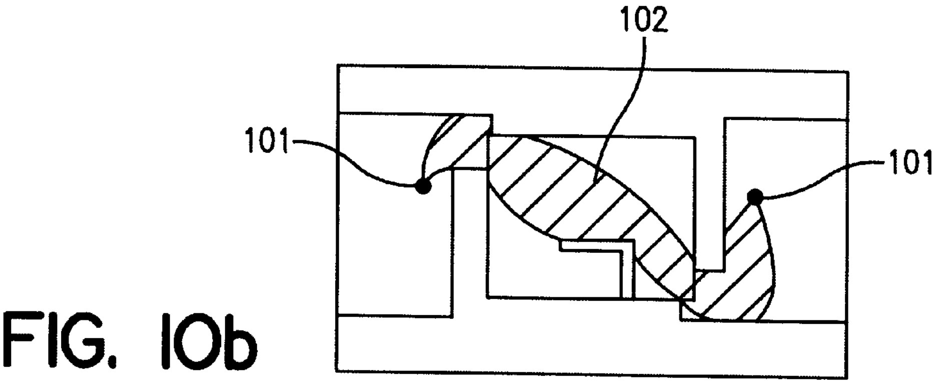
Figure 10C:
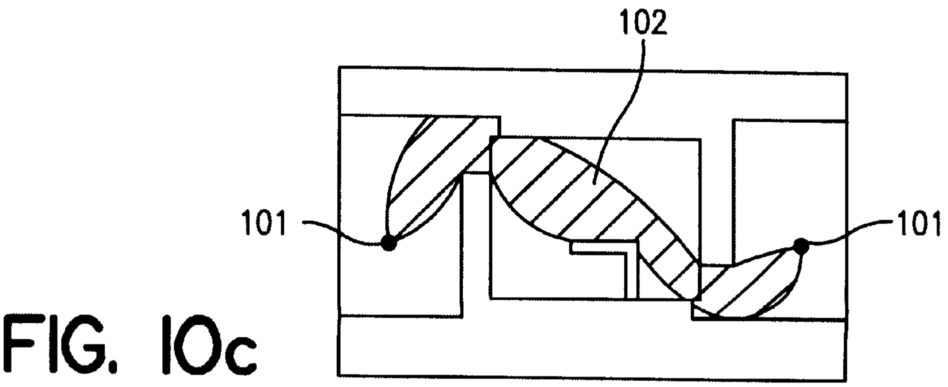
Figure 11:
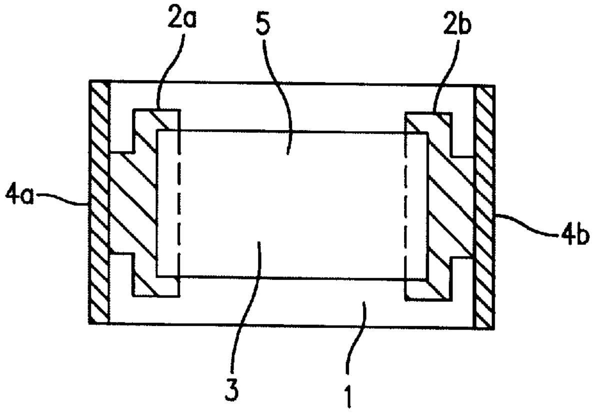
FIG. 11 PRIOR ART
FIG. 11 is a plan view of a conventional resistor.
Figure 12:
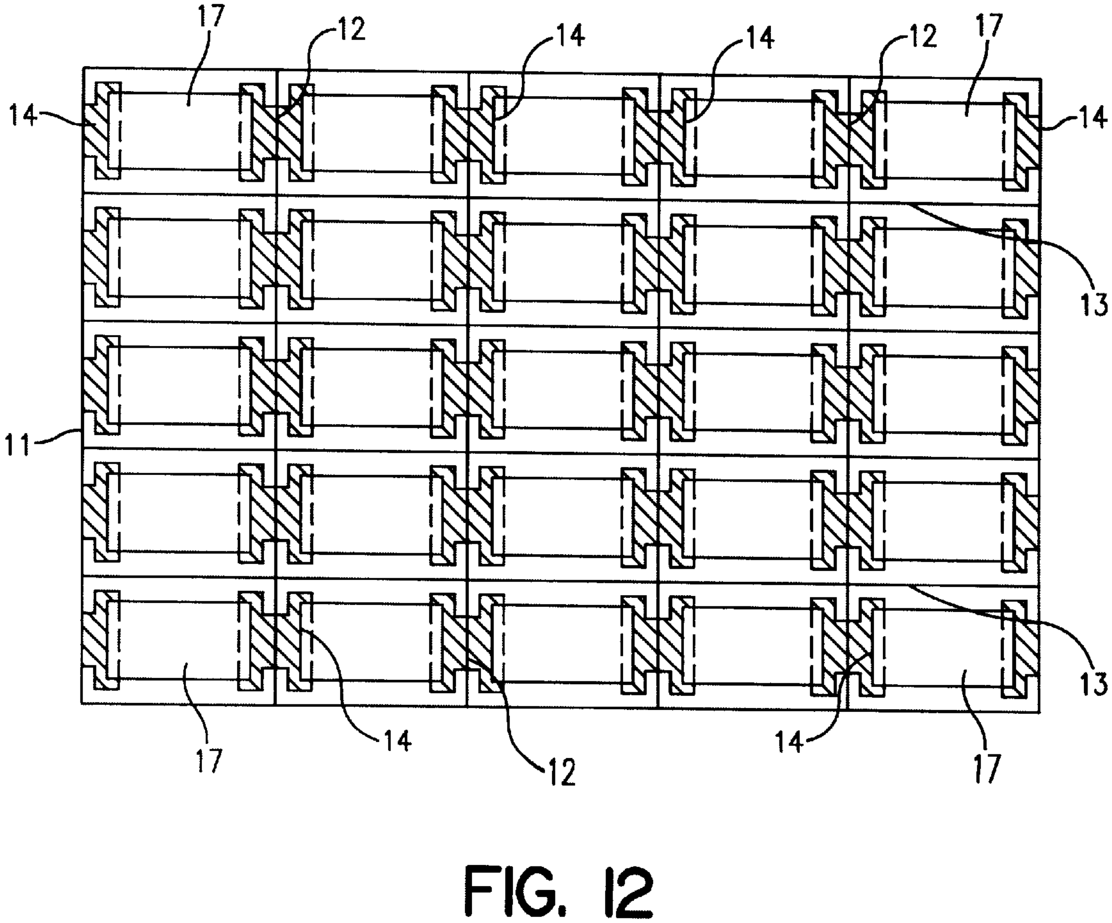
FIG. 12 PRIOR ART
FIG. 12 is a process chart used to illustrate key portion of the manufacturing process.
Figure 13A:
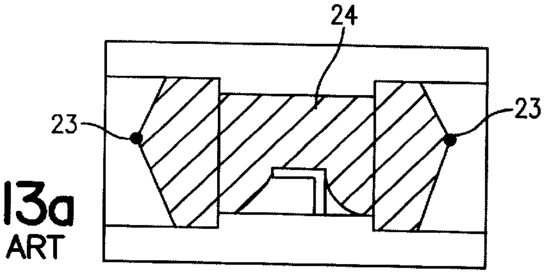
FIG. 13a PRIOR ART
FIGS. 13(*a*)–(*f*) show path models of electric current flow during measurement of the resistance of the resistor.
Figure 13B:
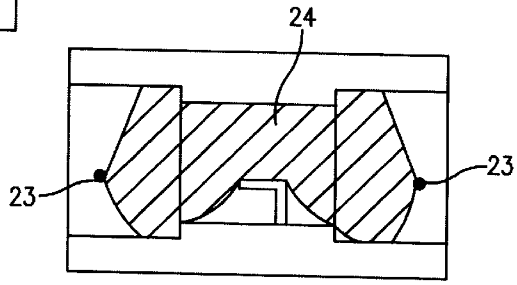
FIG. 13b PRIOR ART
Figure 13C:
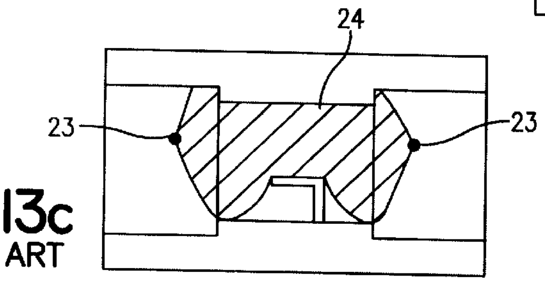
FIG. 13c PRIOR ART
Figure 13D:
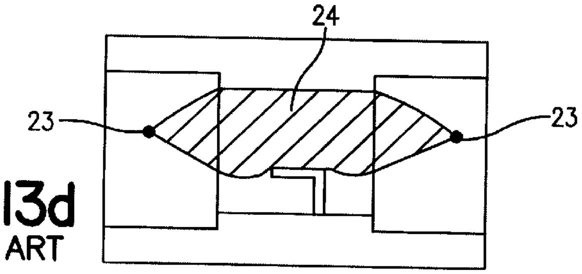
FIG. 13d PRIOR ART
Figure 13E:
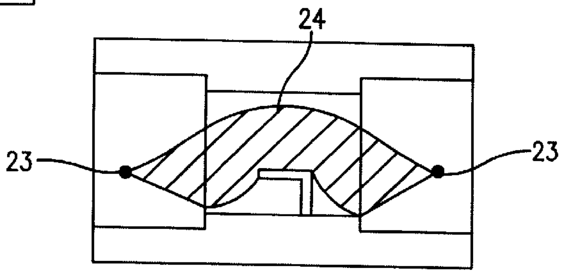
FIG. 13e PRIOR ART
Figure 13F:
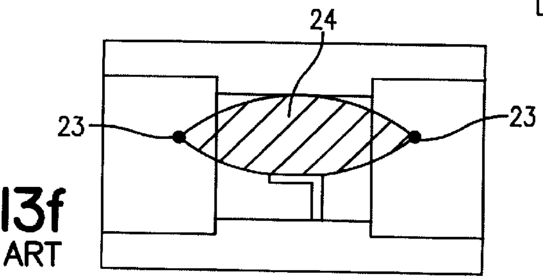
FIG. 13f PRIOR ART

FIGS. 10(*a*), (*b*) and (*c*) illustrate operational models in a resistor of embodiment 3 still under the manufacturing process. The positions of contact probes on the upper-surface electrode layers during trimming are indicated with numeral 101. The path of electric current during measurement of resistance is indicated with numeral 102. In the drawings, the positions 101 of contact probe are varying. As seen in FIGS. 10(*a*), (*b*) and (*c*), the path of electric current does not show a significant change despite the variation in the position of contact probes in the present embodiment; as compared with FIGS. 13(*d*), (*e*) and (*f*), where the path of electric current significantly changed during the resistance measurement. The notched section provided in the upper-surface electrode layers curtailed the change in the path of electric current. Thus, a precise resistance is measured regardless of the variation in the position of contact probes with the upper-surface electrode layer; therefore, the accuracy of the trimming is improved.

The characteristics of resistors are compared in the following.

Using a 4-point probe for the low resistance measurement, sheets of 70 mΩ average resistance resistor have been trimmed to a targeted 100 mΩ of resistance. A deviation of the resistance after the trimming was measured.

The above-presented Table 1 compares the deviation in the accuracy of the trimming among the conventional resistors and those of embodiment 3 of the present invention.

As seen in Table 1, a resistor in accordance with embodiment 3 of the present invention has a structure that is least influenced by the positional variation of contact probes on the upper-surface electrode layers in the measurement of resistance value, as compared with that of conventional resistors. Therefore, the accuracy of trimming is improved; as a result, resistors with a resistance precisely adjusted to be close to a targeted value can be obtained.

INDUSTRIAL APPLICABILITY

A resistor in accordance with the present invention is formed of a substrate, a pair of upper-surface electrode layers having respectively a notched section provided on both sides of the upper surface of the substrate, a resistor layer provided so that it is connected electrically to the upper-surface electrode layers, a protective layer formed to cover at least the resistance layer, and side-face electrode layers which are provided on both side faces of the substrate so that these layers are overlapping on part of the upper-surface electrode layers for electrical connection. Because of the notched section disposed in the pair of upper-surface electrode layers provided on both sides of the upper surface of the substrate, path of the electric current flowing in a resistor layer remains in a same stable route during the trimming operation, even if contact positions of the probes for the resistance measurement on the upper-surface electrode layer vary. Thus, even among the resistors of low resistance, their resistance may be controlled so as to be precisely within a prescribed range.

What is claimed is:

1. A resistor comprising a substrate, a pair of upper-surface electrode layers provided on an upper surface of said substrate, at least one of said electrode layers includes a notched section a resistor layer electrically connected between said upper-surface electrode layers;

side-face electrode layers provided on side faces of said substrate each in contact with a respective one of said upper-surface electrode layers; and a protective layer covering said resistor layer and said notched section.

2. A resistor comprising a substrate, a pair of upper-surface electrode layers provided on an upper surface of said substrate, a pair of reverse-surface electrode layers provided on both sides of reverse surface of said substrate, a resistor layer electrically connected between said upper-surface electrode layers, side-face electrode layers provided on side faces of said substrate, each in electrical contact with a respective one of said upper-surface electrode layers; wherein at least one of said upper-surface electrode layers includes a notched section, and a protective layer covering said resistor layer and said notched section.

3. The resistor of claim 1 or claim 2, wherein the protective layer is disposed overlapped on at least the notched section of said upper-surface electrode layer.

* * * * *